United States Patent
Kim et al.

(10) Patent No.: US 11,476,840 B2
(45) Date of Patent: Oct. 18, 2022

(54) COMPARATOR CIRCUIT AND SWITCH CONTROL DEVICE INCLUDING THE SAME

(71) Applicant: Samsung SDI Co., Ltd., Yongin-si (KR)

(72) Inventors: Keunyoung Kim, Yongin-si (KR); Hyun Kim, Yongin-si (KR); Jaesoon Park, Yongin-si (KR); Sunho Choi, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 17/446,575

(22) Filed: Aug. 31, 2021

(65) Prior Publication Data

US 2022/0069808 A1    Mar. 3, 2022

(30) Foreign Application Priority Data

Sep. 1, 2020    (KR) .......................... 10-2020-0111165

(51) Int. Cl.
| | |
|---|---|
| *H03K 5/153* | (2006.01) |
| *H03K 3/013* | (2006.01) |
| *H03K 5/24* | (2006.01) |

(52) U.S. Cl.
CPC ............... *H03K 3/013* (2013.01); *H03K 5/24* (2013.01)

(58) Field of Classification Search
CPC ........ H03K 5/2481; H03K 5/249; H03K 5/08; H03K 5/24; G01R 19/16519

(Continued)

(56) References Cited

U.S. PATENT DOCUMENTS

| | | |
|---|---|---|
| 2002/0101263 A1 | 8/2002 | Kinoshita et al. |
| 2005/0218969 A1 | 10/2005 | Yoshizawa |

(Continued)

FOREIGN PATENT DOCUMENTS

| | | |
|---|---|---|
| JP | 3606814 B2 | 1/2005 |
| JP | 2005-291865 A | 10/2005 |

(Continued)

OTHER PUBLICATIONS

EPO Extended Search Report dated Feb. 7, 2022, for corresponding European Patent Application No. 21193488.0 (9 pages).

*Primary Examiner* — Quan Tra
(74) *Attorney, Agent, or Firm* — Lewis Roca Rothgerber Christie LLP (57) ABSTRACT

A comparator circuit includes: a comparator comprising: a first input terminal receiving an input voltage; a second input terminal receiving a reference voltage; an output terminal outputting an output signal according to a result of a comparison between the input voltage and the reference voltage; and a power supply terminal receiving an operating voltage; and a mode controller applying a first operating voltage and a first reference voltage to the second input terminal and the power supply terminal of the comparator for a predetermined delay time in response to a supply of power being initiated from a power supply, and applying a second operating voltage and a second reference voltage to the second input terminal and the power supply terminal of the comparator in response to the delay time elapsing, wherein the first operating voltage is higher than a ground voltage and is lower than the second operating voltage.

15 Claims, 5 Drawing Sheets

(58) Field of Classification Search
USPC .................................. 327/77, 142, 143, 198
See application file for complete search history.

(56) References Cited

U.S. PATENT DOCUMENTS

| | | |
|---|---|---|
| 2014/0285243 A1 | 9/2014 | Nakamoto et al. |
| 2020/0278713 A1* | 9/2020 | Hashemi ................. G05F 3/205 |
| 2020/0326359 A1* | 10/2020 | Terasaki ........... G01R 19/16504 |
| 2020/0387183 A1* | 12/2020 | Hermann ................. H03K 5/24 |

FOREIGN PATENT DOCUMENTS

| | | |
|---|---|---|
| JP | 2011-82785 A | 4/2011 |
| JP | 2014-72845 A | 4/2014 |

* cited by examiner

COMPARATOR CIRCUIT AND SWITCH CONTROL DEVICE INCLUDING THE SAME

CROSS-REFERENCE TO RELATED APPLICATION

The present application claims priority to and the benefit of Korean Patent Application No. 10-2020-0111165 filed in the Korean Intellectual Property Office on Sep. 1, 2020, the entire content of which is incorporated herein by reference.

BACKGROUND

1. Field

Aspects of some embodiments of the present invention relate to a comparator circuit, and a switch control device including the same.

2. Description of the Related Art

A glitch refers to an unintentional pulse signal, and is caused by noise, the case where a logic circuit operates out of timing, and the like. The glitch may cause fatal errors in control signals, such as a signal clock and a gate signal. Accordingly, it may be desirable to limit the effects of an intermittent or simultaneous glitch in a normally operating system.

A separate digital circuit may be used for detecting and limiting a glitch signal. However, it may be difficult to apply the method to situations where an analog circuit operates before the time when a digital circuit (for example, a microprocessor) starts operation and a glitch signal affects the analog circuit. For example, in the case of a system for controlling a switch by an output signal of a comparator circuit, a switch and a system may have malfunction due to a glitch signal generated in the comparator circuit before a digital circuit detects and limits a glitch signal.

The above information disclosed in this Background section is only for enhancement of understanding of the background and therefore the information discussed in this Background section does not necessarily constitute prior art.

SUMMARY

Aspects of some embodiments of the present invention include a comparator circuit which is capable of preventing malfunction of a switch due to a glitch signal by limiting generation of the glitch signal in a comparator circuit, and a switch control device including the same.

Aspects of some embodiments of the present invention include a comparator circuit, including: a comparator including a first input terminal and a second input terminal, which receive an input voltage and a reference voltage, respectively, an output terminal which outputs an output signal according to a result of a comparison between the input voltage and the reference voltage, and a power supply terminal which receives an operating voltage; and a mode controller configured to apply a first operating voltage and a first reference voltage to the second input terminal and the power supply terminal of the comparator for a predetermined delay time when a supply of power is initiated from a power supply, and apply a second operating voltage and a second reference voltage to the second input terminal and the power supply terminal of the comparator after the delay time elapses. Herein, the first operating voltage may be higher than a ground voltage and be lower than the second operating voltage.

According to some embodiments, the mode controller may include: a delay signal generator configured to generate a delay signal that is maintained in a first state for the delay time and is changed to a second state when the delay time elapses; a voltage controller connected to the power supply and configured to generate the first operating voltage and the first reference voltage, or the second operating voltage and the second reference voltage from a voltage supplied from the power supply; and a mode selector configured to receive the delay signal, control the voltage controller so as to apply the first operating voltage and the first reference voltage to the comparator when the delay signal is in the first state, and control the voltage controller so as to apply the second operating voltage and the second reference voltage to the comparator when the delay signal is in the second state.

According to some embodiments, in the comparator circuit, the delay signal generator may include: a timer configured to count the delay signal; and a signal generator configured to output the delay signal in the first state or the second state according to an output signal of the timer.

According to some embodiments, in the comparator circuit, the voltage controller may include: a first resistor connected between the power supply and a first node; a second resistor connected between the first node and a second node; a third resistor connected between the second node and a third node; and a fourth resistor connected between the third node and a ground. In the comparator circuit, the power supply terminal may be connected to the first node, and the second input terminal may be connected to the third node.

According to some embodiments, the mode selector may include a selection switch connected between the second node and the ground, and the delay signal may be input as a control signal of the selection switch.

According to some embodiments, in the comparator circuit, the selection switch may be switched to an on-state when the delay signal is in the first state, and may be switched to an off-state when the delay signal is in a second state.

According to some embodiments, in the comparator circuit, when the supply of the power from the power supply is interrupted, the timer may be reset and the signal generator may maintain the delay signal in the first state for a predetermined time.

According to some embodiments of the present invention, a switch control device includes: a comparator including a first input terminal and a second input terminal, which receive an input voltage and a reference voltage, respectively, an output terminal which outputs an output signal according to a result of a comparison between the input voltage and the reference voltage as a control signal of a switch, and a power supply terminal which receives an operating voltage; a voltage controller configured to generate a first operating voltage and a first reference voltage or a second operating voltage and a second reference voltage from a voltage supplied from a power supply; and a mode selector configured to control the voltage controller so that the first operating voltage and the first reference voltage are applied to the power supply terminal and the second input terminal of the comparator for a predetermined delay time when a supply of power is initiated from the power supply, and control the voltage controller so that the second operating voltage and the second reference voltage are applied to the power supply terminal and the second input terminal of the comparator when the delay time elapses. Herein, the first operating voltage may be higher than a ground voltage and may be lower than the second operating voltage.

According to some embodiments, the switch control device may further include a delay signal generator configured to output a delay signal to the mode selector, maintain the delay signal in a first state for the delay time, and change the delay signal to a second state when the delay time elapses. The mode selector may control the voltage controller according to the delay signal.

According to some embodiments, in the switch control device, the delay signal generator may include: a timer configured to count the delay signal; and a signal generator configured to output the delay signal in the first state or the second state according to an output signal of the timer.

According to some embodiments, in the switch control device, the voltage controller may include: a first resistor connected between the power supply and a first node; a second resistor connected between the first node and a second node; a third resistor connected between the second node and a third node; and a fourth resistor connected between the third node and a ground. The power supply terminal may be connected to the first node, and the second input terminal may be connected to the third node.

According to some embodiments, in the switch control device, the mode selector may include a selection switch connected between the second node and the ground, and the delay signal may be input as a control signal of the selection switch.

According to some embodiments, in the switch control device, the selection switch may be switched to an on-state when the delay signal is in the first state, and may be switched to an off-state when the delay signal is in a second state.

According to some embodiments, in the switch control device, when the supply of the power from the power supply is interrupted, the timer may be reset and the signal generator may maintain the delay signal in the first state for a predetermined time.

According to some embodiments, in the switch control device, the first operating voltage may be lower than a threshold voltage of the switch.

According to some embodiments of the present invention, it may be possible to prevent or reduce instances of malfunctions of a switch controlled by a comparator circuit by suppressing generation of a glitch signal in the comparator circuit.

DETAILED DESCRIPTION

Hereinafter, aspects of some embodiments of the present invention will be described in more detail with reference to the accompanying drawings. Hereinafter, with reference to the accompanying drawings, some characteristics and features of some embodiments according to the present disclosure, and the implementation methods thereof, will be described in more detail. Like reference numerals presented in each drawing designate like elements throughout the specification, and some overlapping description thereof may be omitted. However, embodiments according to the present invention may be implemented in various forms, and should not be construed as being limited to the example embodiments described herein. Rather, the example embodiments are provided by way of example so that the present disclosure will be more thorough and more complete, and will more fully convey some aspects and features of some embodiments according to the present invention to those skilled in the art.

Accordingly, processes, elements, and technologies deemed not necessary to those skilled in the art for complete understanding of the aspects and features of the present invention may not be described. In the drawings, the relative sizes of elements, layers, and regions may be exaggerated for clarity.

In the present specification, the term "and/or" includes every combination or any combination of the plurality of related listed items. The term "~may" used in describing the example embodiments of the present invention means "one or more example embodiments of the present invention". In the following description of the example embodiment of the present invention, terms in the singular form may include the plural form unless the context dictates otherwise.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

In describing the example embodiments, the expression "connection" means electrical connection. Electric connection of two constituent elements includes only only a case where the two constituent elements are directly connected, but also a case where the two constituent elements are connected through another constituent element interposed therebetween. Other constituent elements may include a switch, a resistor, a capacitor, and the like.

Hereinafter, a comparator circuit according to some embodiments of the present invention and a switch control device including the same will be described in detail with reference to the necessary drawings.

Figure 1:
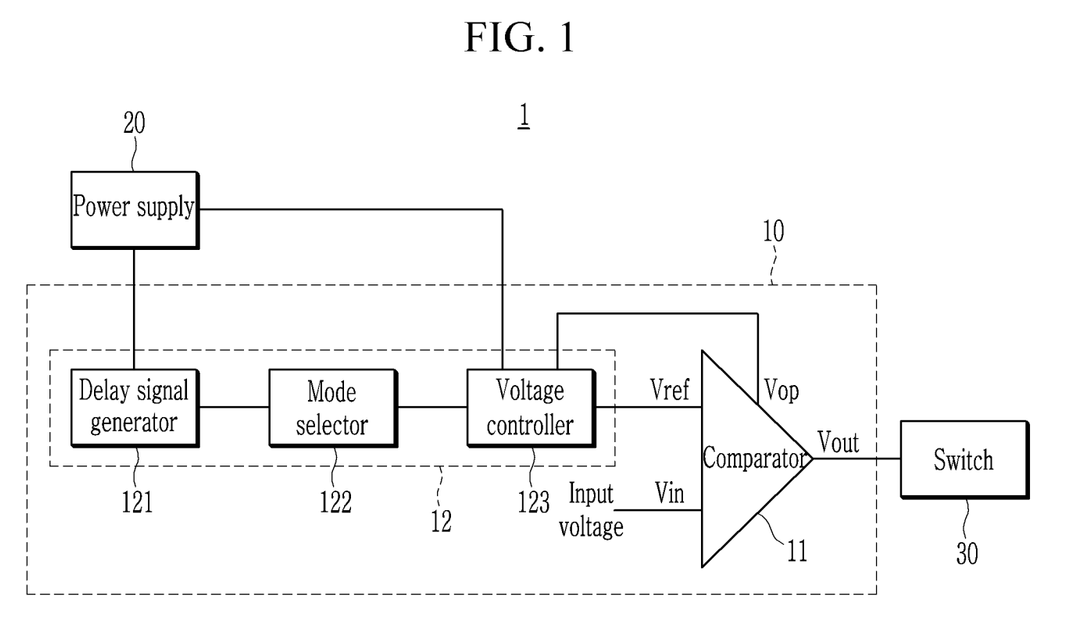
FIG. 1 schematically illustrates a switch control device according to some embodiments of the present invention.
Figure 2:
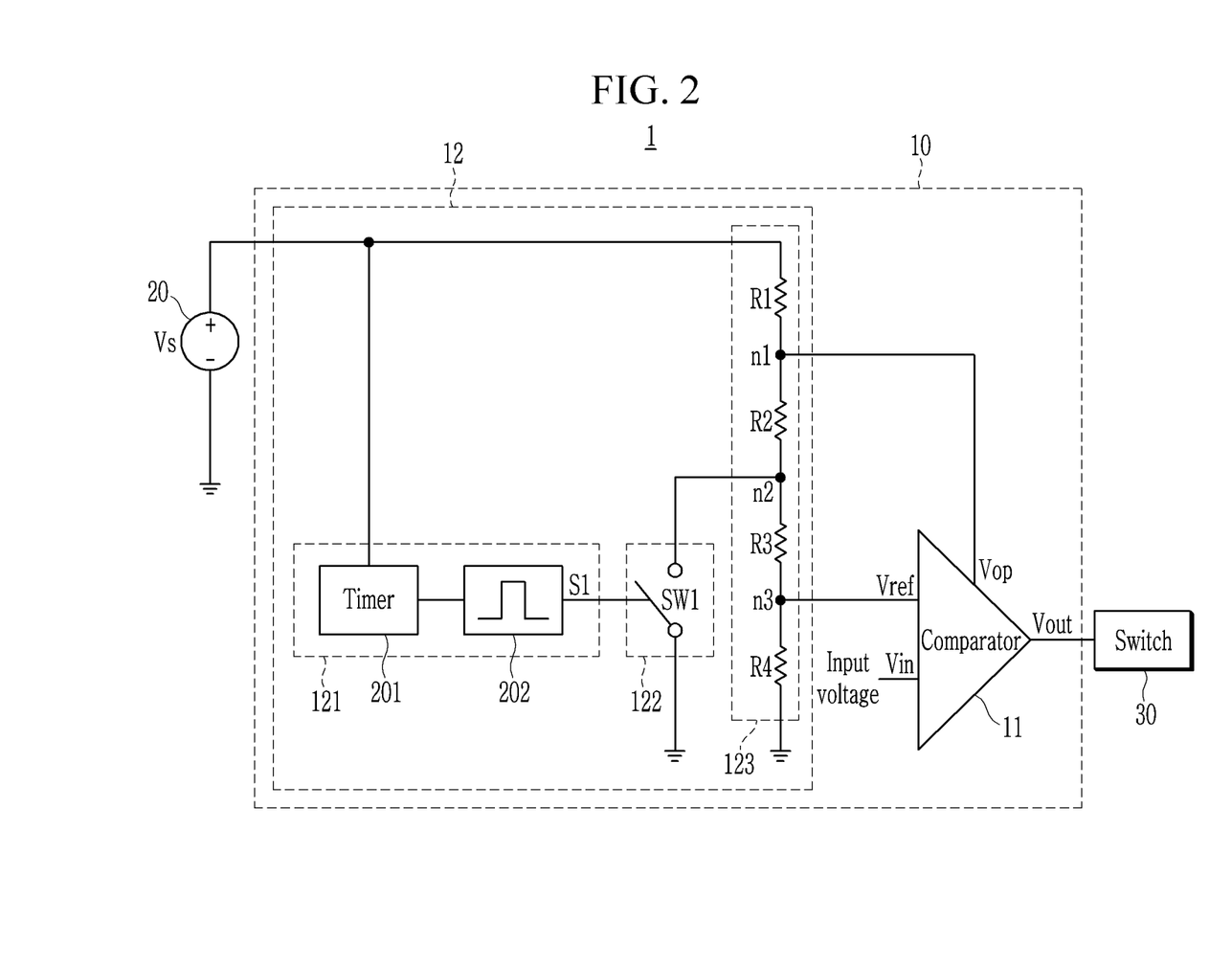
FIG. 2 illustrates an example of a circuit configuration of the switch control device according to some embodiments of the present invention.
Figure 3:
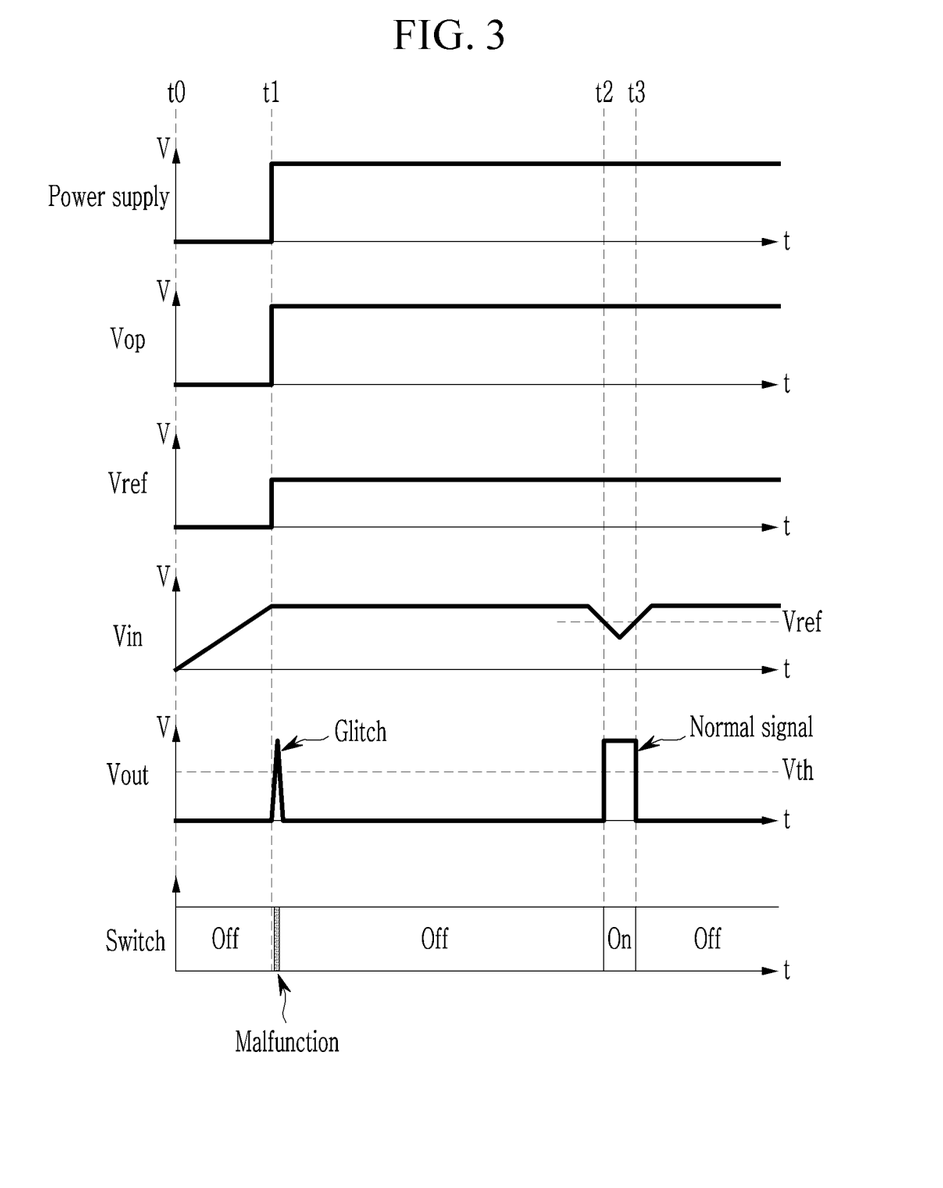
FIG. 3 illustrates an example in which a glitch signal is generated in a comparator circuit.

FIG. 1 schematically illustrates a switch control device according to some embodiments of the present invention, and FIG. 2 illustrates an example of a circuit configuration of the switch control device of FIG. 1. Further, FIG. 3 illustrates an example in which a glitch signal is generated in a comparator circuit.

Referring to FIG. 1, a switch control device 1 according to some embodiments of the present invention may include a comparator circuit 10, a power supply 20 for supplying an operating voltage to the comparator circuit 10, and a switch 30 of which a conduction state is controlled according to an output signal of the comparator circuit 10.

The comparator circuit 10 may include a comparator 11 and a mode controller 12 controlling an operation mode of the comparator 11.

The comparator 11 may include input terminals (e.g., two input terminals, although embodiments are not necessarily limited thereto), to which an input voltage and a reference voltage are input, respectively, and an output terminal, which outputs an output signal corresponding to a result of a comparison between the input voltage and the reference voltage through the output terminal. The comparator 11 may further include a power supply terminal to which the operating voltage of the comparator 11 is applied, and a voltage level of the output signal of the comparator 11 may be limited according to a voltage level of the voltage applied to the power supply terminal.

The mode controller 12 may control an operation mode of the comparator 11 by adjusting the operating voltage and the reference voltage applied to the comparator 11.

FIG. 3 illustrates an example in which a glitch signal is generated in the system including the comparator. Referring to FIG. 3, when an input voltage Vin of the comparator is the voltage generated before an operation of the system, such as a voltage of a battery cell, a glitch signal may be output to the output terminal of the comparator at the moment of the application of an operating voltage Vop and a reference voltage Vref to the comparator according to the operation of the system. The glitch signal may be generated by first applying the input voltage Vin to the comparator 11 in the state where the operating voltage Vop and the reference voltage Vref of the comparator 11 are not sufficiently stable at the initial stage of the operation of the power supply. In the case of the system of FIG. 1 in which the output signal Vout of the comparator is applied as a control signal of the switch 30, the glitch signal may cause malfunction of the switch 30, so that it is necessary to limit the glitch signal.

The mode controller 12 may limit the generation of the glitch signal at the initial operation of the comparator 11 by lowering the operating voltage Vop and the reference voltage Vref of the comparator 11 than the operating voltage Vop and the reference voltage Vref at the time of the normal operation and supplying the lowered operating voltage Vop and reference voltage Vref for a time period (e.g., a set or predetermined period of time) (hereinafter, referred to as the "delay time") from the time at which the power supply 20 operates and initiates power supply. Then, when the states of the power supply 20 and the comparator 11 become stable, the mode controller 12 may make the comparator 11 be normally operated by supplying the operating voltage Vop and the reference voltage Vref in the normal state.

For the operation, the mode controller 12 may include a delay signal generator 121, a mode selector 122, and a voltage controller 123.

When the power supply from the power supply 20 is initiated, the delay signal generator 121 may be woken up (e.g., activated or turned on). When the delay signal generator 121 is woken up, the delay signal generator 121 may output a delay signal in a first state for a delay time (e.g., a set or predetermined delay time), and then when the delay time elapses, the delay signal generator 121 may control the delay signal in a second state.

Referring to FIG. 2 as an example, the delay signal generator 121 may include a timer 201 and a signal generator 202. The timer 201 may count the delay time. That is, when the power supply from the power supply 20 is initiated, the timer 201 initiates counting, and when the counting is completed for the delay time (e.g., the set or predetermined delay time), the timer 201 may terminate the counting operation. When the counting is completed for the delay time (e.g., the set or predetermined delay time), the timer 201 may output a completion signal to the signal generator 202. The signal generator 202 may output a delay signal S1, and control a state of the delay signal, that is, a voltage level, based on the completion signal of the timer 201. For example, the signal generator 202 outputs a delay signal of a first state (for example, a low level) until the completion signal is received from the timer 201, and when the completion signal is received from the timer 201, the signal generator 202 may control the state of the delay signal to the second state (for example, a high level).

In the meantime, the timer 201 and the signal generator 202 illustrated in FIG. 2 are an example of the delay signal generator 121, and a circuit including a different configuration which is capable of generating a delay signal may also be used as the delay signal generator 121. For example, a signal generation circuit using RC time constant, or an internal timer and a general-purpose input/output (GPIO) device of a microprocessor may be used as the delay signal generator 121.

Referring back to FIG. 1, the mode selector 122 may select the operation mode of the comparator 11 by controlling a voltage output of the voltage controller 123, which will be described in more detail below, according to the delay signal output from the delay signal generator 121.

The voltage controller 123 may generate the operating voltage Vop and the reference voltage Vref of the comparator 11 from the voltage supplied from the power supply 20, and apply the generated operating voltage Vop and reference voltage Vref to the comparator 11. The voltage controller 123 may adjust the voltage levels of the operating voltage Vop and the reference voltage Vref under the control of the mode selector 122. The voltage controller 123 may supply the operating voltage Vop and the reference voltage Vref at the level lower than the level of the normal state to the comparator 11 at the initial stage of the operation of the power supply 20 under the control of the mode selector 122. Then, when the delay time elapses after the operation of the power supply 20, the voltage controller 123 may supply the operating voltage Vop and the reference voltage Vref in the normal state to the comparator 11 under the control of the mode selector 122.

For example, referring to FIG. 2, the voltage controller 123 may include a voltage distributor circuit including (or consisting of) a plurality of resistors R1 to R4 serially connected with each other between the power supply 20 and the ground. The first resistor R1 of the voltage distributor circuit may be connected between the power supply 20 and a first node n1, the second resistor R2 of the voltage distributor circuit may be connected between the first node n1 and a second node n2, the third resistor R3 of the voltage distributor circuit may be connected between the second node n2 and a third node n3, and the fourth resistor R4 of the voltage distributor circuit may be connected between the third node n3 and the ground. The power supply terminal of the comparator 11 may be connected to the first node n1, the mode selector 122 may be connected to the second node n2, and an input terminal for inputting the reference voltage Vref of the comparator 11 may be connected to the third node n3. The mode selector 122 may include a selection switch SW1 connected between the second node n2 and the ground.

Referring to FIG. 2, on/off of the selection switch SW1 may be controlled according to the delay signal of the delay signal generator 121. When the delay signal is in the first state, the selection switch SW1 is operated in the on-state (conduction state or closed state) to connect the second node n2 and the ground, and when the delay signal is in the second state, the selection switch SW1 is operated in the off-state (non-conduction state or open state) to block the connection between the second node n2 and the ground.

In the state where the second node n2 is connected with the ground, the voltage Vs supplied from the power supply 20 may be distributed only by the first and second resistors R1 and R2 and applied as the operating voltage Vop of the comparator 11, and the ground voltage may be applied as the reference voltage Vref of the comparator 11. In the meantime, in the state where the second node n2 is not connected with the ground, the voltage Vs supplied from the power supply 20 may be distributed by a resistor combination of the first resistor R1 and the second, third, and fourth resistors R2, R3, and R4 and applied as the operating voltage Vop of the comparator 11. Further, in the state where the second node n2 is not connected with the ground, the voltage Vs supplied from the power supply 20 may be distributed by a resistor combination of the first, second, and third resistors R1, R2, and R3 and the fourth resistor R4 and applied as the reference voltage Vref of the comparator 11.

Accordingly, the operating voltage Vop and the reference voltage Vref of the comparator 11 in the state where the second node n2 is connected with the ground may have voltage levels lower than those of the operating voltage Vop and the reference voltage Vref of the comparator 11 in the state where the second node n2 is not connected with the ground.

Resistance values of the first to fourth resistors R1 to R4 may be designed so that the operating voltage Vop of the comparator 11 in the state where the second node n2 is connected with the ground has a voltage level (for example, 100 mV to 200 mV) lower than a threshold voltage of the switch 30. A size of the output signal of the comparator 11 may be limited by the voltage level of the operating voltage Vop applied to the comparator 11. Accordingly, when the voltage of 100 mV to 200 mV is applied as the operating voltage Vop of the comparator 11, even though the glitch signal is generated by the comparator 11, the size of the signal is insignificant, so that the glitch signal cannot affect the operation of the switch 30. Further, when the voltage of the level or voltage (e.g., a set or predetermined level or voltage) (for example, 100 mV to 200 mV) that is not the ground voltage is applied as the operating voltage Vop of the comparator 11 and then the normal level of operating voltage Vop is supplied, the comparator 11 may relatively quickly make a response without the generation of the glitch signal. In the normal state, the operating voltage Vop may be equal to or higher than the threshold voltage of the switch 30.

Resistance values of the first to fourth resistors R1 to R4 are designed so that the reference voltage Vref of the comparator 11 in the state where the second node n2 is connected to the ground has a voltage level required as the reference voltage of the comparator 11, and the voltage level required as the reference voltage may be differently set according to the system to which the switch control device 1 is applied. In the meantime, FIG. 2 illustrates the case where the voltage controller 123 is designed so that the ground voltage is applied with the reference voltage Vref of the comparator 11 for the delay time after the power supply 20 operates as an example, but embodiments according to the present invention are not limited thereto. The voltage applied as the reference voltage Vref of the comparator 11 for the delay time after the power supply 20 operates may also have a voltage level higher than that of the ground voltage. Even in this case, the voltage applied as the reference voltage Vref of the comparator 11 for the delay time after the power supply 20 operates may be the voltage lower than the reference voltage Vref in the normal state.

Hereinafter, an operation method of the switch control device 1 will be described in more detail with reference to FIG. 4.

Figure 4:
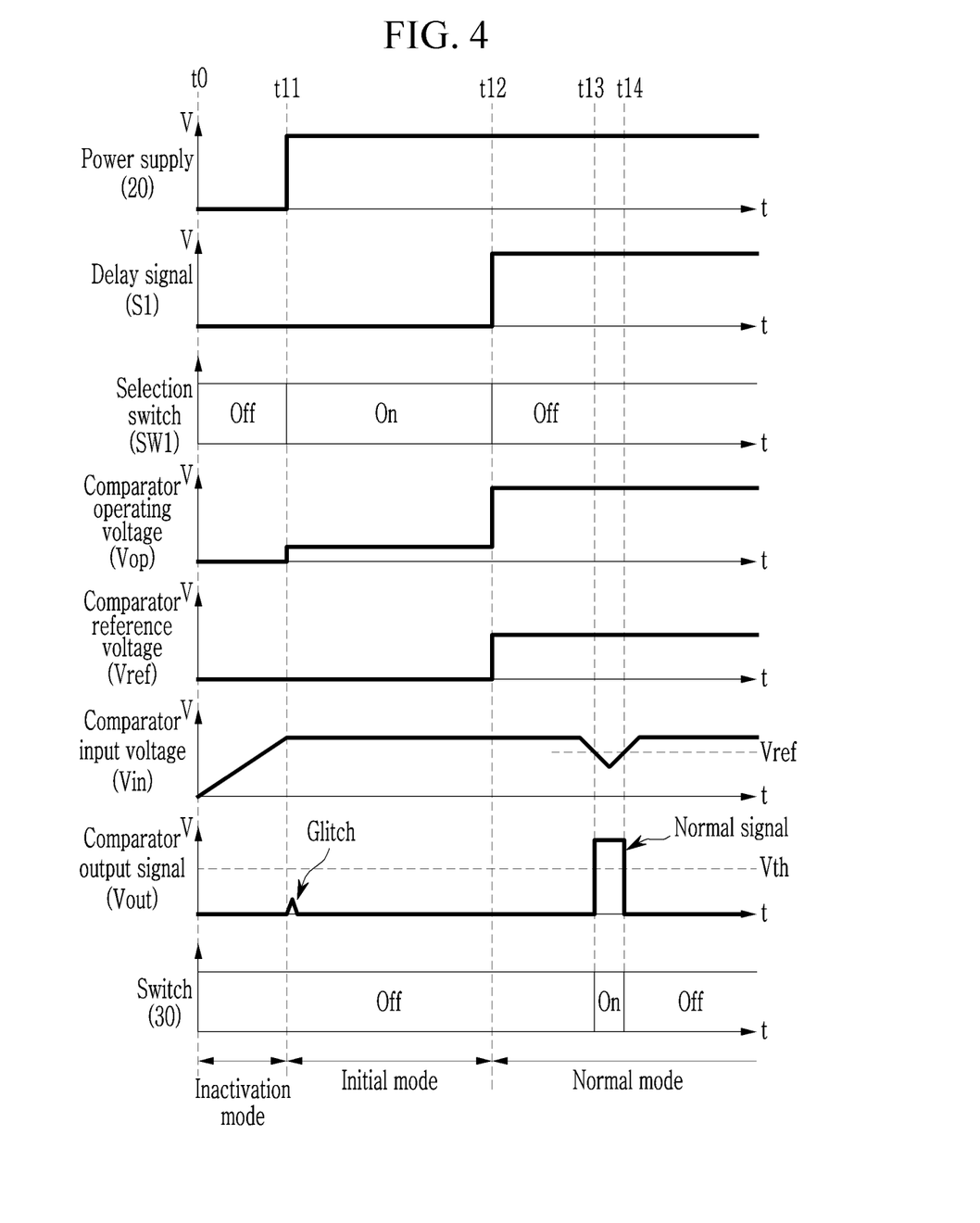
FIG. 4 illustrates an example of an operation timing diagram of the switch control device according to some embodiments of the present invention.

FIG. 4 schematically illustrates an operation timing diagram of the switch control device 1 according to some embodiments of the present invention.

Referring to FIG. 4, in a section (see a section from t0 to t1) before the power supply 20 operates, the comparator 11 operates in an inactivation mode because the operating voltage Vop has not been applied. In the meantime, when a voltage, such as a cell voltage of a battery cell, irrelevant to the operation of the power supply 20 is detected through the comparator 11, an input voltage Vin at a voltage level (e.g., a set or predetermined voltage level) may be applied to the input terminal of the comparator 11 even in the state where the power supply 20 is not activated. In this state, when the power supply 20 operates and the comparator 11 operates, the comparator 11 may operate before the operating voltage Vop and the reference voltage Vref of the comparator 11 are stabilized to generate a glitch signal. Accordingly, the switch control device 1 operates in an initial mode in which the operating voltage Vop and the reference voltage Vref of the comparator 11 are maintained lower than the normal state for the time period (e.g., the set or predetermined time period) after the power supply 20 operates, and operates in the normal mode by controlling the operating voltage Vop and the reference voltage Vref of the comparator 11 to be in the normal state after the time period (e.g., the set or predetermined time period), which will be described in more detail below.

At time t11, the power supply 20 operates, so that the supply of the power to the switch control device 1 from the power supply 20 is initiated. Further, the delay signal generator 121 is woken up (or activated or turned on), and maintains a delay signal S1 in a first state for a delay time (e.g., a set or predetermined delay time) (see a section from t11 to t12).

The delay signal S1 of the delay signal generator 121 is transmitted as a control signal of the selection switch SW1 configuring the mode selector 122. The selection switch SW1 is switched to the on-state in response to the delay signal S1 at time t11, and then maintains the on-state for the delay time (see the section from t11 to t12).

Figure 5:
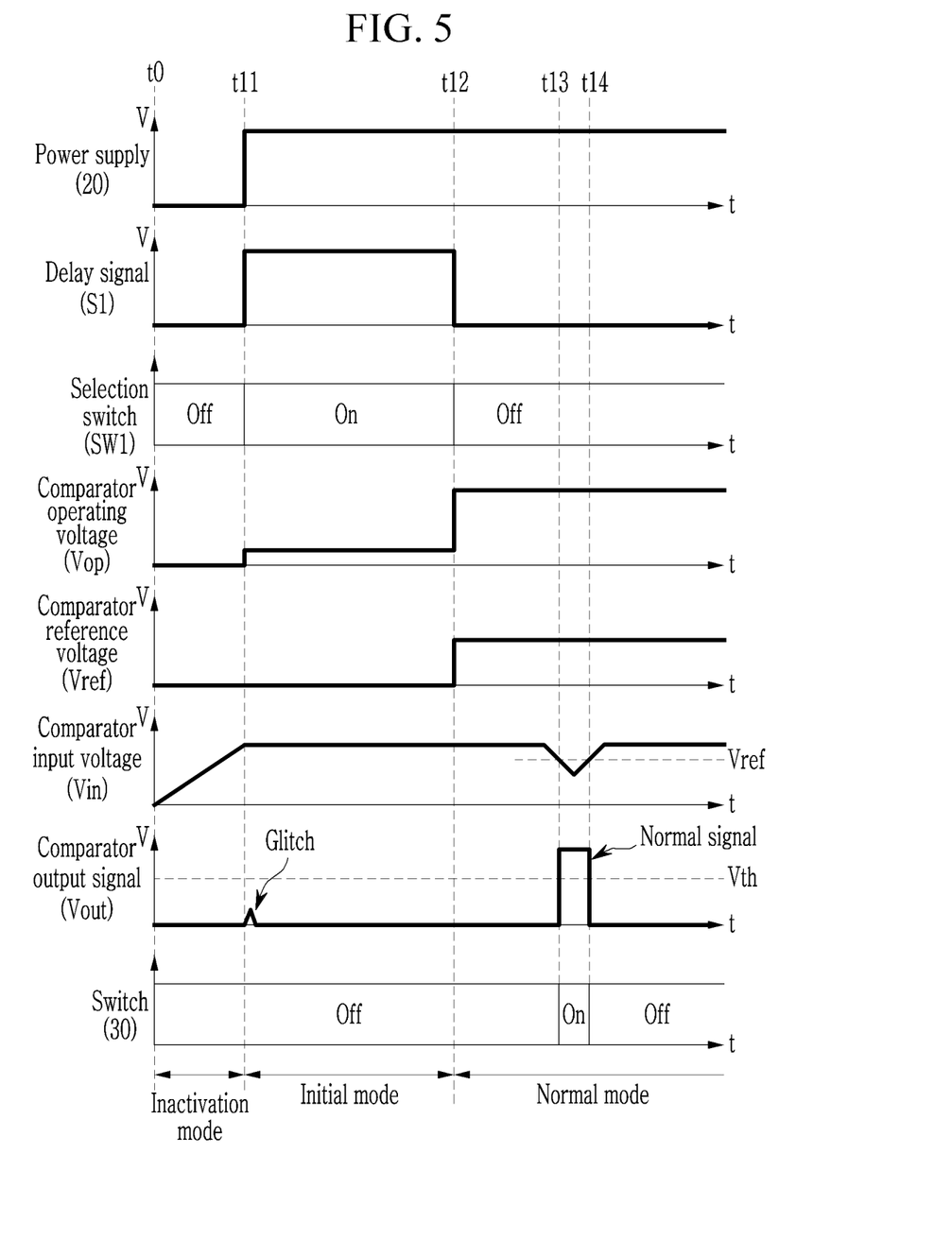
FIG. 5 illustrates another example of an operation timing diagram of the switch control device according to some embodiments of the present invention.

FIG. 4 illustrates the case where the initial value, that is, the first state, of the delay signal S1 has the low level and the selection switch SW1 is the switch device (for example, a P-channel Metal Oxide Semiconductor Field Effect transistor (MOSFET) and a PNP transistor) controlled to be the on-state by the low level of control signal as an example. However, embodiments according to the present invention are not limited thereto, so that as illustrated in FIG. 5, the initial value, that is, the first state, of the delay signal S1 may have the high level and the selection switch SW1 may be the switch device (for example, an N-channel MOSFET and an NPN transistor) controlled to be the on-state by the high level of control signal.

As the selection switch SW1 is switched to the on-state at time t11, the voltage distributor circuit of the voltage controller 123 distributes the voltage Vs supplied from the power supply 20 by using only the first resistor R1 and the second resistor R2, and the voltage distributed by the first and second resistors R1 and R2 is supplied as the operating voltage Vop of the comparator 11 for the delay time (see the section from t11 to t12). Accordingly, for the delay time (see the section from t11 to t12), the voltage at the lower level than that of a threshold voltage Vth of the switch 30 is supplied as the operating voltage Vop of the comparator 11, and thus, even though the glitch signal is generated in the output Vout of the comparator 11, the glitch signal has a non-significant signal size, so that the glitch signal may be ignored. Further, the ground voltage may be applied as the reference voltage Vref of the comparator 11 for the delay time (see the section from t11 to t12).

At time t12 after the delay time, the delay signal generator 121 controls the delay signal S1 to be the second state, and the selection switch SW1 of the mode selector 122 is switched to the off state. Accordingly, in the voltage distributor circuit of the voltage controller 123, the voltage distributed by the first resistor R1 and the resistance combination of the second, third, and fourth resistors R2, R3, and R3 is supplied as the operating voltage Vop of the comparator 11, so that the operating voltage Vop in the normal state is supplied to the comparator 11. Further, the voltage distributed by the resistance combination of the first, second, and third resistors R1, R2, and R3, and the fourth resistor R4 is supplied as the reference voltage Vref of the comparator 11, so that the reference voltage Vref in the normal state is supplied to the comparator 11.

As described above, the operating voltage Vop and the reference voltage Vref in the normal state are supplied to the comparator 11, so that the comparator 11 initiates a normal monitoring operation for the input voltage Vin. For example, as illustrated in FIG. 4, when the input voltage Vin is higher than the reference voltage Vref (see the section form t12 to t13), the comparator 11 may output the low level of output signal Vout, and when the input voltage Vin is lower than the reference voltage Vref (see the section form t13 to t14), the comparator 11 may output the high level of output signal Vout. Further, for example, when the input voltage Vin is higher than the reference voltage Vref, the comparator 11 may output the high level of output signal Vout, and when the input voltage Vin is lower than the reference voltage Vref, the comparator 11 may output the low level of output signal Vout.

The output signal Vout of the comparator 11 is transmitted as the control signal of the switch 30, so that on/off of the switch 30 is controlled according to the output signal Vout of the comparator 11. For example, as illustrated in FIG. 4, when the output signal Vout of the comparator 11 is at the low level, the switch 30 may operate in the off state, and when the output signal Vout of the comparator 11 is at the high level, the switch 30 may operate in the on state. Further, for example, when the output signal Vout of the comparator 11 is at the high level, the switch 30 may operate in the off state, and when the output signal Vout of the comparator 11 is at the low level, the switch 30 may operate in the on state.

In the meantime, when the supply of the power from the power supply 20 is interrupted, the timer 201 of the delay signal generator 121 is reset and prepares for a next operation, and the signal generator 202 controls the delay signal S1 in the first state for the time period (e.g., the set or predetermined period of time). Accordingly, the operating voltage Vop and the reference voltage Vref of the comparator 11 may be rapidly removed, and the generation of the glitch signal may be suppressed even at the termination time of the supply of power of the power supply 20.

According to the foregoing example embodiments, the switch control device 1 may suppress the size of the glitch signal generated in the comparator 11 when the power supply 20 operates or the operation of the power supply 20 is terminated, thereby preventing or reducing instances of malfunction of the switch 30.

The electronic or electric device and/or any other related device or constituent element according to the example embodiments of the present invention described herein may be implemented by using any suitable hardware, firmware (for example, an application-specific integrated circuit), software, or a combination of software, firmware, and hardware. For example, various constituent elements of the devices may be formed on one integrated circuit (IC) chip or a separate IC chip. Further, various constituent elements of the devices may be implemented on a flexible printed circuit film, a tape carrier package (TCP), a printed circuit board (PCB), or one substrate. The electric connection or interconnection described in the present specification may be implemented, for example, by wiring or conductive elements on a PCB or other type of circuit carrier. The conductive element may include, for example, metallization, such as surface metallization and/or pins, and may include conductive polymers or ceramics. Further, electrical energy may be transmitted via a wireless connection using, for example, electromagnetic radiation or light.

Further, various constituent elements of the devices may be a process or a thread which is executed in one or more processors for performing various functions described herein, executed in one or more computing devices, executes a computer program command, and interacts with other system constituent elements. The computer program command is stored in a memory, for example, a random access memory (RAM), implementable in a computing device using a standard memory device. The computer program command may also be stored in a non-transitory computer readable medium, for example, a CD-ROM and a flash drive.

Further, those skilled in the art will appreciated that the functions of various computing devices may be combined or integrated into a single computing device, or the function of a specific computing device may be distributed across one or more other computing devices without departing from the scope of the example embodiments of the present invention.

DESCRIPTION OF SOME OF THE REFERENCE SYMBOLS

1: Switch control device
10: Comparator circuit
11: Comparator
12: Mode controller
121: Delay signal generator
122: Mode selector
123: Voltage controller
20: Power supply
30: Switch
201: Timer
202: Signal generator
SW1: Selection switch
R1, R2, R3, R4: Resistors of voltage distributor circuit

What is claimed is:

1. A comparator circuit, comprising:
   a comparator comprising:
      a first input terminal configured to receive an input voltage;
      a second input terminal configured to receive a reference voltage;
      an output terminal configured to output an output signal according to a result of a comparison between the input voltage and the reference voltage; and
      a power supply terminal configured to receive an operating voltage; and
   a mode controller configured to apply a first operating voltage and a first reference voltage to the second input terminal and the power supply terminal of the comparator for a predetermined delay time in response to a supply of power being initiated from a power supply, and to apply a second operating voltage and a second reference voltage to the second input terminal and the power supply terminal of the comparator in response to the predetermined delay time elapsing, wherein the first operating voltage is higher than a ground voltage and is lower than the second operating voltage.

2. The comparator circuit of claim 1, wherein:
the mode controller includes:
a delay signal generator configured to generate a delay signal that is maintained in a first state for the predetermined delay time and is changed to a second state in response to the predetermined delay time elapsing;
a voltage controller connected to the power supply and configured to generate the first operating voltage and the first reference voltage, or the second operating voltage and the second reference voltage from a voltage supplied from the power supply; and
a mode selector configured to receive the delay signal, to control the voltage controller so as to apply the first operating voltage and the first reference voltage to the comparator in response to the delay signal being in the first state, and to control the voltage controller so as to apply the second operating voltage and the second reference voltage to the comparator in response to the delay signal being in the second state.

3. The comparator circuit of claim 2, wherein:
the delay signal generator includes:
a timer configured to count the delay signal; and
a signal generator configured to output the delay signal in the first state or the second state according to an output signal of the timer.

4. The comparator circuit of claim 2, wherein:
the voltage controller includes:
a first resistor connected between the power supply and a first node;
a second resistor connected between the first node and a second node;
a third resistor connected between the second node and a third node; and
a fourth resistor connected between the third node and a ground voltage source, and
the power supply terminal is connected to the first node, and the second input terminal is connected to the third node.

5. The comparator circuit of claim 4, wherein:
the mode selector includes a selection switch connected between the second node and the ground voltage source, and the selection switch is configured to receive the delay signal as a control signal.

6. The comparator circuit of claim 5, wherein:
the selection switch is configured to be switched to an on-state in response to the delay signal being in the first state, and is configured to be switched to an off-state in response to the delay signal being in a second state.

7. The comparator circuit of claim 3, wherein:
in response to the supply of the power from the power supply being interrupted, the timer is configured to be reset and the signal generator is configured to maintain the delay signal in the first state for a predetermined time.

8. A switch control device, comprising:
a comparator comprising:
a first input terminal configured to receive an input voltage;
a second input terminal configured to receive a reference voltage;
an output terminal configured to output an output signal according to a result of a comparison between the input voltage and the reference voltage as a control signal of a switch; and
a power supply terminal configured to receive an operating voltage;
a voltage controller configured to generate a first operating voltage and a first reference voltage or a second operating voltage and a second reference voltage from a voltage supplied from a power supply; and
a mode selector configured to control the voltage controller so that the first operating voltage and the first reference voltage are applied to the power supply terminal and the second input terminal of the comparator for a predetermined delay time in response to a supply of power being initiated from the power supply, and to control the voltage controller so that the second operating voltage and the second reference voltage are applied to the power supply terminal and the second input terminal of the comparator in response to the predetermined delay time elapsing, wherein the first operating voltage is higher than a ground voltage and is lower than the second operating voltage.

9. The switch control device of claim 8, further comprising:
a delay signal generator configured to output a delay signal to the mode selector, to maintain the delay signal in a first state for the predetermined delay time, and to change the delay signal to a second state in response to the predetermined delay time elapsing,
wherein the mode selector is configured to control the voltage controller according to the delay signal.

10. The switch control device of claim 9, wherein:
the delay signal generator includes:
a timer configured to count the delay signal; and
a signal generator configured to output the delay signal in the first state or the second state according to an output signal of the timer.

11. The switch control device of claim 9, wherein:
the voltage controller includes:
a first resistor connected between the power supply and a first node;
a second resistor connected between the first node and a second node;
a third resistor connected between the second node and a third node; and
a fourth resistor connected between the third node and a ground voltage source, and
the power supply terminal is connected to the first node, and the second input terminal is connected to the third node.

12. The switch control device of claim 11, wherein:
the mode selector includes a selection switch connected between the second node and the ground voltage source, and the selection switch is configured to receive the delay signal as a control signal.

13. The switch control device of claim 12, wherein:
the selection switch is configured to be switched to an on-state in response to the delay signal being in the first state, and is configured to be switched to an off-state in response to the delay signal being in a second state.

14. The switch control device of claim 10, wherein:
in response to the supply of the power from the power supply being interrupted, the timer is configured to be reset and the signal generator is configured to maintain the delay signal in the first state for a predetermined time.

15. The switch control device of claim 8, wherein:
the first operating voltage is lower than a threshold voltage of the switch.

* * * * *